United States Patent
Li et al.

(10) Patent No.: US 11,289,878 B2
(45) Date of Patent: Mar. 29, 2022

(54) NANOLASER BASED ON DEPTH-SUBWAVELENGTH GRAPHENE-DIELECTRIC HYPERBOLIC DISPERSIVE CAVITY

(71) Applicant: ZHENGZHOU UNIVERSITY OF AERONAUTICS, Henan (CN)

(72) Inventors: Yan Li, Henan (CN); Facheng Zhong, Henan (CN); Yanyan Wang, Henan (CN); Peng Yang, Henan (CN); Kun Xu, Henan (CN); Pei Ding, Henan (CN); Fanguang Zeng, Henan (CN)

(73) Assignee: ZHENGZHOU UNIVERSITY OF AERONAUTICS, Henan (CN)

( * ) Notice: Subject to any disclaimer, the term of this patent is extended or adjusted under 35 U.S.C. 154(b) by 0 days.

(21) Appl. No.: 17/098,942

(22) Filed: Nov. 16, 2020

(65) Prior Publication Data
US 2021/0344168 A1    Nov. 4, 2021

(30) Foreign Application Priority Data
Apr. 30, 2020    (CN) .......................... 202010390526.0

(51) Int. Cl.
*H01S 5/10*    (2021.01)
*H01S 5/04*    (2006.01)

(52) U.S. Cl.
CPC ............ *H01S 5/1042* (2013.01); *H01S 5/041* (2013.01); *H01S 5/1039* (2013.01)

(58) Field of Classification Search
CPC .................................................... H01S 5/041
See application file for complete search history.

(56) References Cited

U.S. PATENT DOCUMENTS

| 7,569,188 B2 * | 8/2009 | Stockman ............ G01N 21/554 422/82.05 |
| 2013/0148682 A1 * | 6/2013 | Zhang ................... B82Y 20/00 372/45.01 |
| 2018/0203263 A1 | 7/2018 | Long et al. |

FOREIGN PATENT DOCUMENTS

| CN | 102148476 A | 8/2011 |
| CN | 104795721 U | 7/2015 |

(Continued)

OTHER PUBLICATIONS

Gongjian et al., "Negative refraction and bulk plasma properties of graphene-based hyperbolic dispersion materials", «Journal of Physics», Feb. 3, 2015.

(Continued)

*Primary Examiner* — Tuan N Nguyen

(57) ABSTRACT

The disclosure provides a nanolaser based on a depth-subwavelength graphene-dielectric hyperbolic dispersive cavity, comprising a pumping light source and the depth-subwavelength graphene-dielectric hyperbolic dispersive cavity; wherein the depth-subwavelength graphene-dielectric hyperbolic dispersive cavity is a spherical or hemispherical hyperbolic dispersive microcavity formed by alternately wrapping a dielectric core with graphene layers and dielectric layers. Because the graphene plasmon has unique excellent performances, such as an electrical adjustability, a low intrinsic loss, a high optical field localization, and a continuously adjustable resonance frequency from mid-infrared to terahertz, compared with a common metal-dielectric hyperbolic dispersive characteristic, a graphene-dielectric hyperbolic dispersive metamaterial used by the disclosure not only may highly localize an energy of an electromagnetic wave in a more depth-subwavelength cavity, but also may reduce an ohmic loss and improve a quality factor.

7 Claims, 5 Drawing Sheets

(56) References Cited

FOREIGN PATENT DOCUMENTS

| CN | 205646434 U | 10/2016 |
| CN | 107275085 A | 10/2017 |
| CN | 107452844 A | 12/2017 |
| CN | 208368937 A | 1/2019 |

OTHER PUBLICATIONS

Ji Xu et al., "Specific Fabry-Perot resonant transmission property of graphene-dielectric multilayered hyperbolic metamaterials", «Optical Engineering», Jan. 22, 2020.

* cited by examiner

NANOLASER BASED ON DEPTH-SUBWAVELENGTH GRAPHENE-DIELECTRIC HYPERBOLIC DISPERSIVE CAVITY

CROSS REFERENCE TO RELATED APPLICATION

This application claims the priority of Chinese Patent Application No. 202010390526.0, entitled "nanolaser based on depth-subwavelength graphene-dielectric hyperbolic dispersive cavity" filed with the China National Intellectual Property Administration on Apr. 30, 2020, which is incorporated herein by reference in its entirety.

TECHNICAL FIELD

The disclosure relates to the technical field of nanolaser, in particular to a nanolaser based on a depth-subwavelength graphene-dielectric hyperbolic dispersive cavity.

BACKGROUND

Since the 21$^{st}$ century, with a rapid development of increasingly miniaturized and integrated devices, how to design and product a laser light source with a high integration, an ultra-small structure, a good monochromaticity and a high energy density has become a consistent and well-recognized development direction in science. Nanolasers have attracted great research interests as an important optically integrated component. As early as in 2003, Stockman has proposed a concept of Surface Plasmon Amplification by Stimulated Emission of Radiation (SPASER) by utilizing a similarity between a surface plasmon (SP) and a free photon in physical properties, which provides an important theoretical basis for a research of the nanolaser for future high-bit and large-capacity communication transmission. In recent years, nanolasers based on propagating surface plasmons in plasmonic nanostructures, whispering gallery or Fabry-Perot cavities have been theoretically designed and verified experimentally. Because of a high quality factor of this type of the resonant cavity, the nanolaser has been produced with a low threshold. However, it is difficult to reduce a physical size of the cavity below λ/2n (wherein A represents a wavelength in vacuum and n represents a refractive index) in three dimensions, because this type of nanolaser is based on a total internal reflection mechanism to achieve a localization of a light field.

Recent studies have shown that the nanolaser based on a localized surface plasmon (LSP) resonance has been developed experimentally, for example the LSP resonance supported by a core-shell nanoparticles of gold/silica interacts with a gain material to realize a laser lasing. The LSP resonance supported by noble metal nanoparticles may localize photons in a size of subwavelength, which may be much smaller than an incident light wave, thus the advantage of the metal nanoparticles in the design of the nanolaser has been embodied. However, because an intrinsic metal loss of the LSP resonance restricts a maximum quality factor that may be obtained to a great extent (in an order of magnitude 10), this type of laser has a high lasing threshold, for example, a lasing threshold for a nanolaser system with a hemispherical shell reaches 7080 cm$^{-1}$.

At present, a laser based on the propagating surface plasmon has a high quality factor, but it is not conducive to integration due to its large size, while a laser based on localized surface plasmon has a smaller volume for integration, but it's quality factor is greatly reduced due to its intrinsic metal loss.

SUMMARY

The present disclosure intends to provide a nanolaser based on a depth-subwavelength graphene-dielectric hyperbolic dispersive cavity, to address a problem that a traditional laser based on surface plasmon cannot give consideration to both a smaller volume and a higher quality factor.

In order to achieve the above intentions, the disclosure provides the following solutions:

A nanolaser based on a depth-subwavelength graphene-dielectric hyperbolic dispersive cavity, wherein, the nanolaser comprises a pumping light source and the depth-subwavelength graphene-dielectric hyperbolic dispersive cavity;

the depth-subwavelength graphene-dielectric hyperbolic dispersive cavity is a spherical or hemispherical hyperbolic dispersive microcavity formed by alternately wrapping a dielectric core with graphene layers and dielectric layers.

Optionally, the pumping light source is a solid laser or a semiconductor laser.

Optionally, a duty ratio and a dielectric constant of the graphene layer and a refractive index of the dielectric layer meet following formulas: $\varepsilon_r = \varepsilon_G n^2/((1-f_G)\varepsilon_G + f_G n^2) > 0$ and $\varepsilon_\theta = \varepsilon_t = f_G \varepsilon_G + (1-f_G) n^2 < 0$; wherein, $f_G$ represents the duty ratio of the graphene layer, $\varepsilon_G$ represents the dielectric constant of the graphene layer, n represents the refractive index of the dielectric layer; $\varepsilon_r$ represents a dielectric constant in a $\hat{r}$ direction; $\varepsilon_\theta$ represents a dielectric constant in a $\hat{\theta}$ direction; $\varepsilon_t$ represents a dielectric constant in a $\hat{\phi}$ direction.

Optionally, a material of the dielectric layer is magnesium fluoride and silicon dioxide.

Optionally, a gain material is introduced into the dielectric layer; wherein the gain material is selected from gallium arsenide, indium phosphide, cadmium sulfide, zinc oxide, gallium nitride, cadmium selenide, zinc sulfide material, or organic material with an optical gain.

Optionally, a thickness of the graphene layer is 0.5 nm and a thickness of the dielectric layer is 50 nm.

Optionally, the depth-subwavelength graphene-dielectric hyperbolic dispersive cavity is a spherical hyperbolic dispersive microcavity formed by alternately wrapping four pairs of dielectric layers (core) and graphene layers; and a diameter of the spherical hyperbolic dispersive microcavity is 404 nm.

Optionally, a lasing threshold of the spherical hyperbolic dispersive microcavity is 80.6 cm$^{-1}$ at a wavelength of 32.3 μm.

According to detailed embodiments of the disclosure, the disclosure may achieve following technical effects:

The disclosure discloses the nanolaser based on the depth-subwavelength graphene-dielectric hyperbolic dispersive cavity, the nanolaser comprises the pumping light source and the depth-subwavelength graphene-dielectric hyperbolic dispersive cavity; the depth-subwavelength graphene-dielectric hyperbolic dispersive cavity is a spherical or hemispherical hyperbolic dispersive microcavity formed by alternately wrapping the dielectric core with graphene layers and dielectric layers. Because a graphene plasmon has unique excellent performances, such as an electrical adjustability, a low intrinsic loss and a high optical field localization, and a continuously adjustable resonance frequency from mid-infrared to terahertz, compared with a common metal-dielectric hyperbolic dispersive characteristic, a graphene-dielectric hyperbolic dispersive metamaterial used by the disclosure not only may highly localize an energy of an electromagnetic wave in a more depth-subwavelength cavity, but also may reduce an ohmic loss and improve the quality factor. The spherical or hemispherical cavity based on the hyperbolic dispersive relation similar to a whispering gallery mode proposed by the present disclosure may greatly reduce the size thereof while realizing a high quality factor.

BRIEF DESCRIPTION OF THE DRAWINGS

In order to more clearly explain the embodiments of the present disclosure or the technical solutions in the conventional technology, the drawings used in the embodiments will be briefly described below. Obviously, the drawings in the following description are only some embodiments of the present disclosure. For those skilled in the art, other drawings may be obtained based on the drawings without creative works.

FIG. 5 (b) is a schematic diagram showing the electric field intensity distribution characteristics corresponding to the mode $TM_{1,3}$; FIG. 5 (c) is a schematic diagram showing the electric field intensity distribution characteristics corresponding to the mode $TM_{1,2}$; and FIG. 5 (d) is a schematic diagram showing the electric field intensity distribution characteristics corresponding to the mode $TM_{1,1}$;

FIG. 7 (b) is a diagram showing the variation trends of the scatter-ing efficiency and the absorption efficiency with the gain coefficient at the resonance wavelength of $TM_{1,2}$; FIG. 7 (c) is a diagram showing the variation trends of the scattering efficiency and the absorption efficiency with the gain coefficient at the resonance wavelength of $TM_{1,3}$; and FIG. 7 (d) is a diagram showing the variation trends of the scattering efficiency and the absorption efficiency with the gain coefficient at the resonance wavelength of $TM_{1,4}$; and illustrations in FIGS. 7 (a) to (d) respectively show situations of a gain material in different dielectric layers; FIG. 8 (b) is a schematic diagram showing the absorption efficiency spectrum and the scattering efficiency spectrum corresponding to the gain coefficient of 113.422 $cm^{-1}$; FIG. 8 (c) is a schematic diagram showing the absorption efficiency spectrum and the scattering efficiency spectrum corresponding to the gain coefficient of 161.42 $cm^{-1}$; and FIG. 8 (d) is a schematic diagram showing the absorption efficiency spectrum and the scattering efficiency spectrum corresponding to the gain coefficient of 400.3 $cm^{-1}$.

DETAILED DESCRIPTION OF THE EMBODIMENTS

Figure 1:
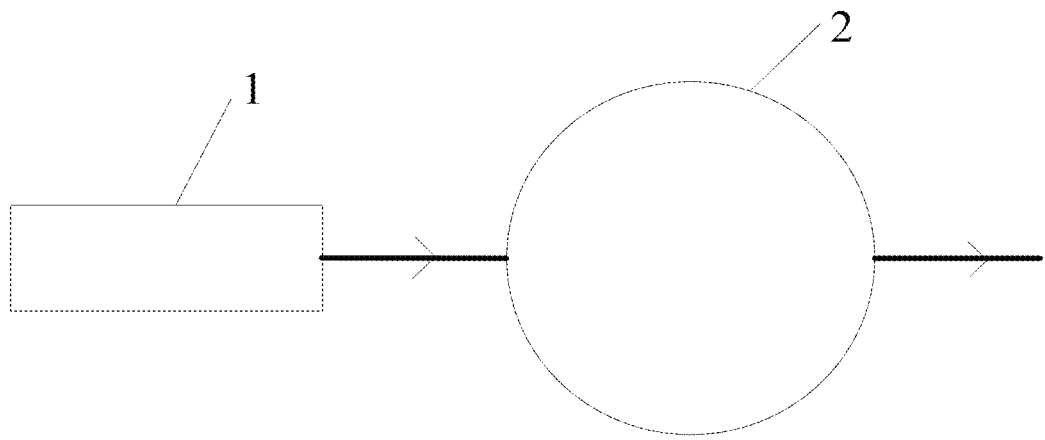
FIG. 1 is a schematic diagram showing an overall structure of the nanolaser based on the depth-subwavelength graphene-dielectric hyperbolic dispersive cavity according to the present disclosure.

In the following, the technical solutions in the embodiments of the present disclosure will be clearly and completely described with reference to the drawings in the embodiments of the present disclosure. Obviously, the described embodiments are only a part of the embodiments of the present disclosure, rather than all the embodiments. Based on the embodiments of the present disclosure, all other embodiments obtained by those skilled in the art without any creative works shall fall within the scope of the present disclosure.

The disclosure intends to provide a nanolaser based on a depth-subwavelength graphene-dielectric hyperbolic dispersive cavity to address the problem that the traditional surface plasmon laser cannot give consideration to both a smaller volume and a higher quality factor.

For a better understanding of above intention, features and advantages of the present disclosure, the disclosure will be described in details by reference to the accompanying drawings and specific embodiments thereof.

Since a hyperbolic dispersive metamaterial has a negative equivalent dielectric constant in at least one direction, a dispersive relation of the hyperbolic dispersive metamaterial shows a hyperbolic expression form. An infinite reciprocal lattice vector may be provided by the hyperbolic dispersive metamaterial due to a non-cut-off property of a k wave vector thereof, so that an electromagnetic wave may be localized in a size of the depth-subwavelength. The spherical hyperbolic dispersive microcavity may highly localize an energy of the electromagnetic wave in the cavity to greatly reduce an ohmic loss, and thus has a higher quality factor compared with a common LSP resonance. The spherical hyperbolic dispersive microcavity and the gain material may be combined to produce a low-threshold nanolaser with depth-subwavelength. However, because metal may be regarded as a perfect electrical conductor in a far infrared-terahertz band and has a poor response to the electromagnetic wave, a design of the hyperbolic metamaterials based on a dielectric-metal multilayer structure is just suitable for visible light-near infrared band.

The plasmon of a graphene material has unique excellent performances, such as an electrical adjustability, a low intrinsic loss and a high optical field localization, and a continuously adjustable resonance frequency from mid-infrared to terahertz. Compared with a common metal/dielectric hyperbolic dispersive characteristic, a hyperbolic dispersive characteristic of graphene not only may highly localize the energy of the electromagnetic wave in a more depth-subwavelength cavity, but also may reduce the ohmic loss and improve the quality factor. Therefore, if considering the unique performances of the graphene materials, the graphene materials may be introduced into a design of a nano-core-shell structure, a hyperbolic superstructure spherical resonant cavity in the far-infrared or even the terahertz band may be theoretically obtained to provide a new system for a research and an application of an interaction between light and matter, which has great significance. In addition, the combination of a hyperbolic dispersive microcavity based on graphene and the gain material can be configured to produce the nanolaser in a mid-infrared or even the terahertz band, so as to provide a new idea for a development of a compacter and lower-threshold plasmonic nanolaser.

Based on the above ideas, the disclosure provides a nanolaser based on a depth-subwavelength graphene-dielectric hyperbolic dispersive cavity. FIG. 1 is a schematic diagram showing an overall structure of the nanolaser based on the depth-subwavelength graphene-dielectric hyperbolic dispersive cavity according to the present disclosure. As shown in FIG. 1, the nanolaser comprises a pumping light source 1 and the depth-subwavelength graphene-dielectric hyperbolic dispersive cavity 2. The depth-subwavelength graphene-dielectric hyperbolic dispersive cavity 2 provided by the present disclosure uses a multilayer graphene/dielectric nano core-shell structure, which is obtained by alternately wrapping the dielectric core with a graphene layer and a dielectric layer, wherein alternately wrapping at one time may form a pair of dielectric layer and graphene layer. Optionally, the depth-subwavelength graphene-dielectric hyperbolic dispersive cavity 2 is a spherical or hemispherical hyperbolic dispersive microcavity formed by alternately wrapping the dielectric core with graphene layers 202 and dielectric layers 201. A pumping light generated by the pumping light source 1 is vertically incident on the depth-subwavelength graphene-dielectric hyperbolic dispersive cavity 2 to form a population inversion in the dielectric layers 201, so as to realize an optical pumping process generated by a laser. Meanwhile, a surface plasmon mode is formed by the vertically incident pumping light stimulated in the resonant cavity, of which meeting a resonance condition may generate a resonance in the resonant cavity. Under a condition of optical pumping, the dielectric layer 201 continuously forms the population inversion to complete a stimulated radiation. The surface plasmon mode in the resonant cavity is emitted from an end of the depth-subwavelength graphene-dielectric hyperbolic dispersive cavity 2 to form a laser.

Optionally, the pumping light source 1 may be a solid laser or a semiconductor laser. A material of the dielectric layer 201 may be a magnesium fluoride or a silicon dioxide.

Figure 2:
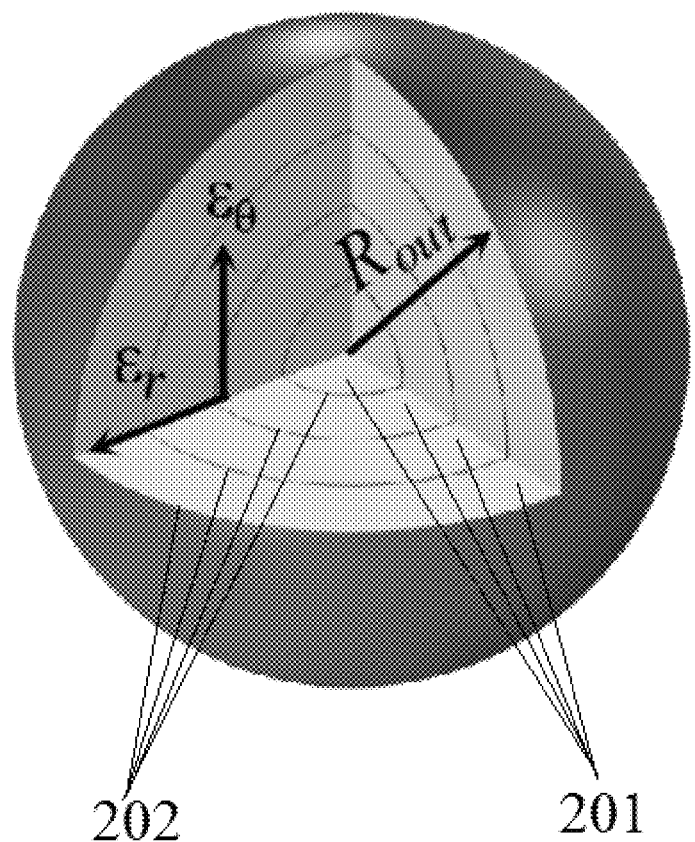
FIG. 2 is a schematic diagram showing a structure of a spherical hyperbolic dispersive microcavity comprising alternating graphene and dielectric layers according to the present disclosure.

FIG. 2 is a schematic diagram showing a structure of the depth-subwavelength graphene-dielectric hyperbolic dispersive cavity provided by an embodiment of the present disclosure. In the embodiment shown in FIG. 2, the depth-subwavelength graphene-dielectric hyperbolic dispersive cavity 2 is a spherical hyperbolic dispersive microcavity formed by alternately wrapping four pairs of dielectric layers (cores) 201 and graphene layers 202, which can also be hemispherical or other shapes. Wherein, the dielectric core is the innermost dielectric layer 201 of the depth-subwavelength graphene-dielectric hyperbolic dispersive cavity 2. A diameter of the spherical hyperbolic dispersive microcavity 2 is 404 nm. A lasing threshold of the spherical hyperbolic dispersive microcavity 2 is 80.6 cm$^{-1}$ at a wavelength of 32.3 μm.

An effective dielectric tensor of a structure of the hyperbolic dispersive microcavity may take a following form:

$$\varepsilon = \hat{r}\hat{r}\varepsilon_r + \hat{\theta}\hat{\theta}\varepsilon_\theta + \hat{\phi}\hat{\phi}\varepsilon_t \quad (1)$$

In formula (1), under a condition of $\varepsilon_r = \varepsilon_G n^2/((1-f_G)\varepsilon_G + f_G n^2) > 0$ and $\varepsilon_\theta = \varepsilon_t = f_G \varepsilon_G + (1-f_G)n^2 < 0$, the wave vector meets $$\frac{k_r^2}{\varepsilon_\theta} + \frac{k_\theta^2}{\varepsilon_r} = \frac{\omega^2}{c^2} = \left(\frac{2\pi}{\lambda}\right)^2,$$

which has a hyperbolic dispersive relation. Wherein, ε represents an effective dielectric constant of a structure of the hyperbolic dispersive microcavity of graphene-dielectric; $f_G$ represents a duty ratio of the graphene, $\varepsilon_G$ represents a dielectric constant of the graphene, n represents a refractive index of the dielectric layer; c represents a speed of light; $\hat{r}$, $\hat{\theta}$, $\hat{\phi}$ represent three directions of a spherical coordinate respectively; $\varepsilon_r$, $\varepsilon_\theta$, $\varepsilon_t$ represent dielectric constants in $\hat{r}$, $\hat{\theta}$, $\hat{\phi}$ directions respectively; $k_r$, $k_\theta$, k represent wave vectors in $\hat{r}$, $\hat{\theta}$, $\hat{\phi}$ directions respectively; ω represents a circular frequency; f represents a frequency, λ represents a wavelength in vacuum, and $R_{out}$ represents an outer radius of the structure of the graphene-dielectric hyperbolic dispersive microcavity 2.

Therefore, in the depth-subwavelength graphene-dielectric hyperbolic dispersive cavity 2 of the present disclosure, the duty ratio and the dielectric constant of the graphene layer and the refractive index of the dielectric layer may meet the following formulas:

$$\varepsilon_r = \varepsilon_G n^2/((1-f_G)\varepsilon_G + f_G n^2) > 0 \text{ and}$$

$$\varepsilon_\theta = \varepsilon_t = f_G \varepsilon_G + (1-f_G)n^2 < 0.$$

Figure 3:
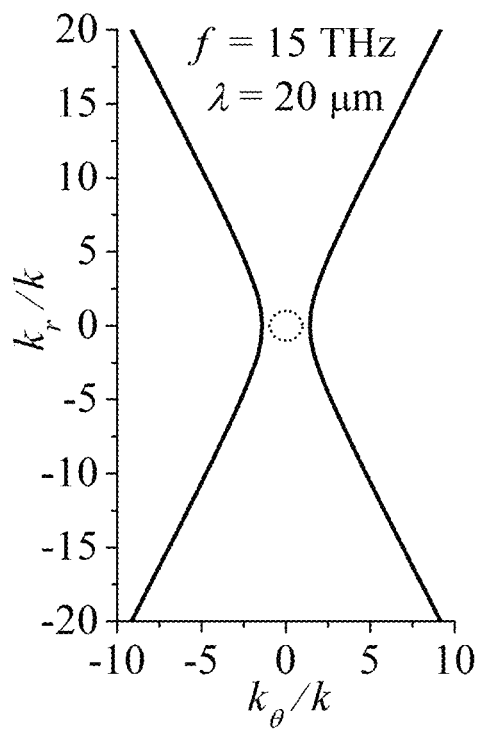
FIG. 3 is a schematic diagram showing an iso-frequency surface (shown in solid lines) of the hyperbolic dispersive microcavity and the iso-frequency surface (shown in dotted lines) of a light in vacuum calculated at a wavelength of $\lambda=20$ μm with an effective dielectric theory according to the present disclosure.

FIG. 3 is a schematic diagram showing an iso-frequency surface of the hyperbolic dispersive microcavity and an iso-frequency surface of the light in vacuum according to the present disclosure. The iso-frequency surface of the hyperbolic dispersive microcavity calculated from the effective dielectric theory at the wavelength of λ=20 μm is shown as the solid lines in FIG. 3, and the iso-frequency surface of the light in vacuum is shown as the dashed lines in FIG. 3. In FIG. 3, the dispersive relation may support an infinite wave vector k when the refractive index of the dielectric is set as n=1.407 and the wavelength in vacuum is set as λ=20 μm, which illustrates that the spherical alternating layer structure of dielectric-graphene used by the depth-subwavelength graphene-dielectric hyperbolic dispersive cavity 2 according to the present disclosure has the hyperbolic dispersive characteristic.

Figure 4:
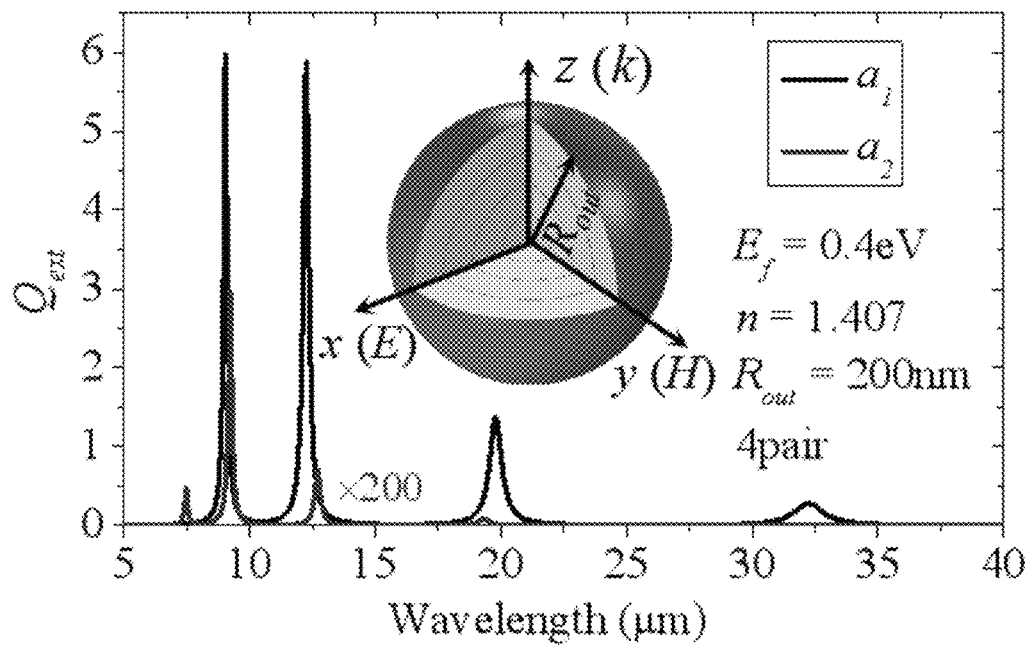
FIG. 4 is a schematic diagram showing a extinction spectrum of the depth-subwavelength graphene-dielectric hyperbolic dispersive cavity (a radius of an inner core is 50 nm, alternately wrapped with 4 graphene layers (with a thickness of 0.5 nm)/3 dielectric layers (with a thickness of 50 nm)) according to the present disclosure.

Optionally, the thickness of the graphene layer is 0.5 nm; and the thickness of the dielectric layer is 50 nm. The disclosure has selected a alternating layer structure of 4 pairs of dielectric layers (with a thickness of 50 nm, and a refractive index of n=1.407) and graphene layers (with a thickness of 0.5 nm) shown in FIG. 2 to perform a calculation by Mie scattering theory. Then it's found that the alternating layer structure has four dipole resonance modes, which are respectively recorded as $TM_{1,1}$, $TM_{1,2}$, $TM_{1,3}$ and $TM_{1,4}$, with corresponding resonance wavelengths of 32.3 µm, 19.8 µm, 12.25 µm and 9.04 µm, as shown in FIG. 4. In FIG. 4, $a_1$ and $a_2$ represent contribution values of the dipole and a quadrupole component respectively; an abscissa Wavelength represents the wavelength, and an ordinate $Q_{ext}$ represents an extinction efficiency of the structure; $E_f$ represents a fermi level of the graphene; 4 pair means that the structure includes 4 pairs of graphene and dielectric layers; and z(k), x(E), and y(H) respectively represent polarizations of an incident light along a direction of z axis, an electric field along a direction of x axis, and a magnetic field along a direction of y axis.

Figure 5:
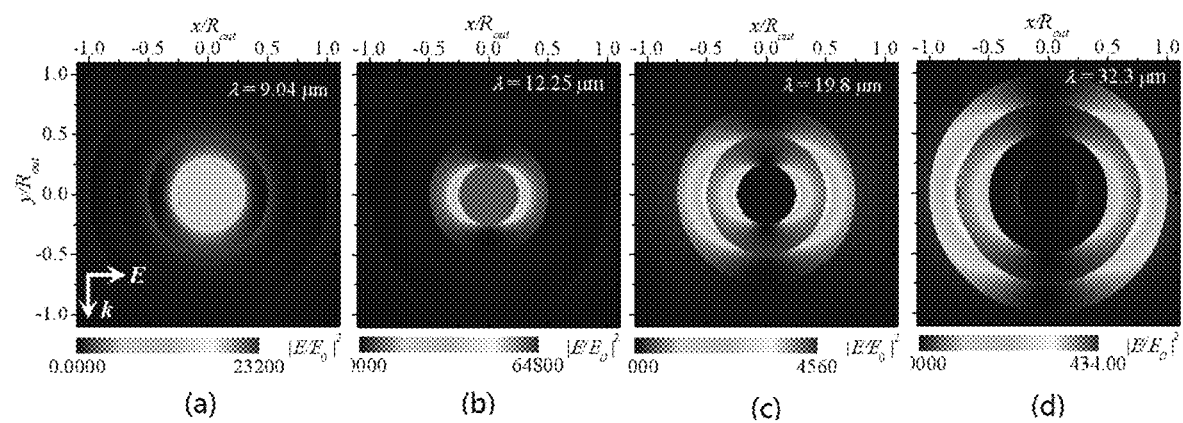
FIG. 5 is a schematic diagram showing electric field intensity distribution characteristics corresponding to four different order modes $TM_{1,1}$, $TM_{1,2}$, $TM_{1,3}$ and $TM_{1,4}$ of a dipole electric resonance provided by the present disclosure; wherein, FIG. 5 (a) is a schematic diagram showing the electric field intensity distribution characteristics corresponding to the mode $TM_{1,4}$.
Figure 6:
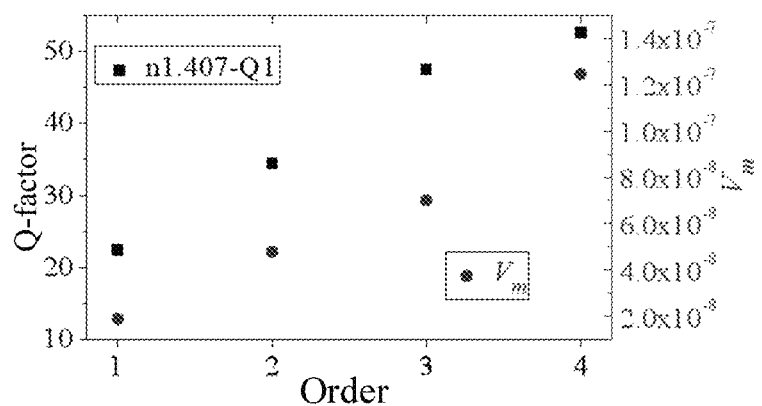
FIG. 6 is a schematic diagram showing Q-factors and mode volumes corresponding to the four different order modes $TM_{1,1}$, $TM_{1,2}$, $TM_{1,3}$, and $TM_{1,4}$ of the dipole electrical resonance provided by the present disclosure.

The electric field distribution corresponding to the four modes is further calculated by using Mie scattering. As shown in FIGS. 5(a)-(d), the electric field intensity of the four resonance modes may be greatly enhanced and be respectively localized in different dielectric layers. For example, as shown in FIG. 5 (d), the electric field of the $TM_{1,1}$ mode is mainly localized in the outermost dielectric; as shown in FIG. 5 (c), the electric field of $TM_{1,2}$ mode is mainly distributed in the second and third layers of dielectric counted from the outside; as shown in FIG. 5 (b), the electric field of $TM_{1,3}$ mode is mainly distributed in the third layer dielectric counted from the outside; and as shown in FIG. 5 (a), the electric field of $TM_{1,4}$ mode is mainly distributed in the dielectric core. Therefore, the graphene spherical hyperbolic dispersive resonant cavity 2 not only has the depth-subwavelength characteristic, but also may generate a huge electric field enhancement. So compared to a conventional Fabry-Perot cavity or a plasmon resonant cavity, a Purcell factor of the depth-subwavelength graphene-dielectric hyperbolic dispersive cavity 2 according to the present disclosure will be greatly improved, which is beneficial to increase a radiation rate of the gain dielectric in the cavity. It may be found through calculation that the Purcell factors of the four resonance modes $TM_{1,1}$, $TM_{1,2}$, $TM_{1,3}$ and $TM_{1,4}$ are as high as $6.356 \times 10^7$, $5.476 \times 10^7$, $5.138 \times 10^7$, and $3.206 \times 10^7$ respectively, as shown in FIG. 6. In FIG. 5, λ represents the wavelength corresponding to the four dipole electrical resonances; k represents a direction of the incident light; E represents electric field intensity; $E_0$ represents electric field intensity of the incident light; x and y respectively represent coordinates of the structure 2 on x axis and y axis; and $R_{out}$ represents an outer radius of the graphene-dielectric hyperbolic dispersive microcavity structure 2. In FIG. 6, $V_m$ represents a mode volume; and n1.407-Q1 represents a Q factor value when the refractive index of the dielectric is taken as n=1.407.

In practical application, the gain material may also be introduced into the dielectric layer 201; wherein the gain material may be selected from gallium arsenide, indium phosphide, cadmium sulfide, zinc oxide, gallium nitride, cadmium selenide, zinc sulfide material, or organic material with an optical gain.

Next, the lasing characteristic of a multi-wavelength nanolaser based on the graphene hyperbolic dispersive microcavity 2 according to the present disclosure is described according to a specific embodiment.

According to a situation that the electric field is localized in different dielectric layers by the hyperbolic dispersive microcavity at the four resonance modes of $TM_{1,1}$, $TM_{1,2}$, $TM_{1,3}$ and $TM_{1,4}$, four different gain materials are introduced into different dielectric layers with relatively strong electric fields, so that the hyperbolic dispersive microcavity 2 may realize lasing at multiple wavelengths in different modes.

Figure 7:
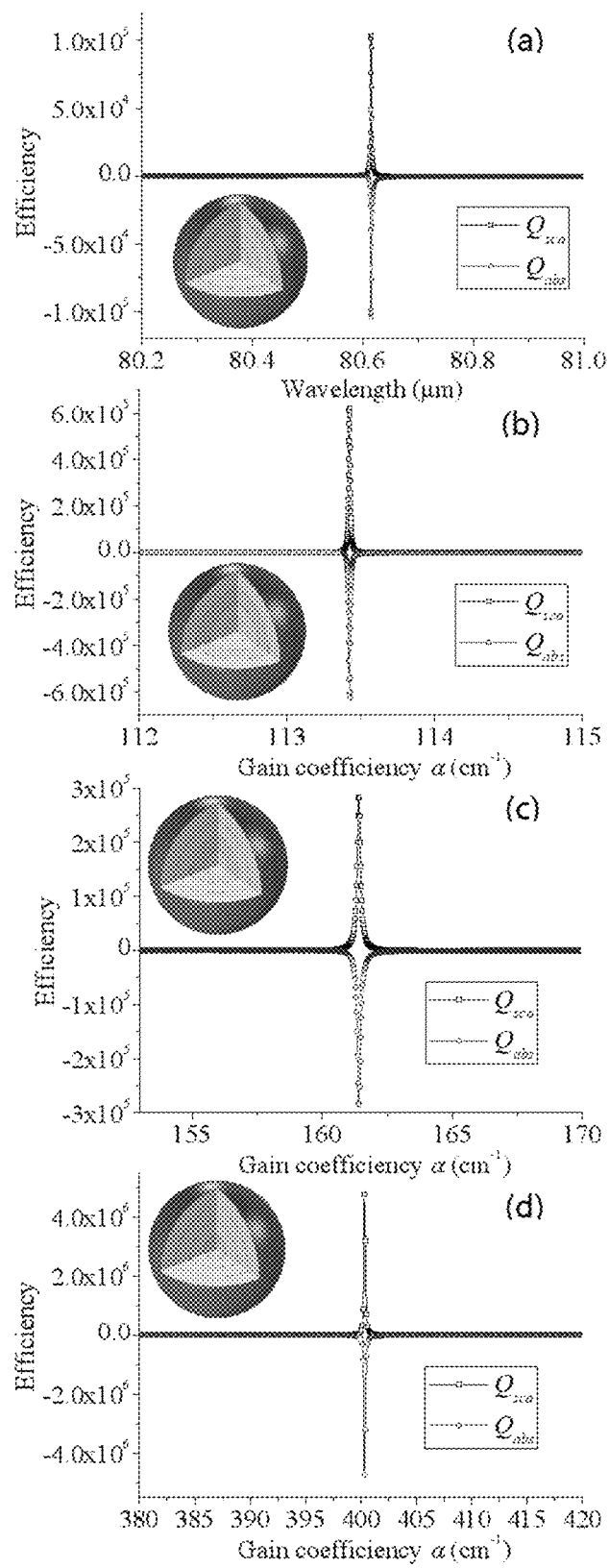
FIG. 7 is diagrams showing variation trends of a scattering efficiency and a absorption efficiency with a gain coefficient corresponding to the four different order modes $TM_{1,1}$, $TM_{1,2}$, $TM_{1,3}$, and $TM_{1,4}$ of the dipole electrical resonance provided by the present disclosure; wherein, FIG. 7 (a) is a diagram showing the variation trends of the scattering efficiency and the absorption efficiency with the gain coefficient at a resonance wavelength of $TM_{1,1}$.

In the calculation, the structure and size of FIG. 2 is still used. In order to simulate the characteristic of the introduced gain material, a complex refractive index n=1.407+i κ and a gain coefficient $\alpha = 2\pi|\kappa|/\lambda$ are introduced in a corresponding dielectric layer 201, wherein κ represents an imaginary part of the refractive index, which is less than 0 for the gain dielectric; and λ represents the wavelength in vacuum. In FIG. 7, the abscissa of each graph is the gain coefficient α, and the ordinate of each graph is the efficiency. FIGS. 7 (a), (b), (c) and (d) show trends that the scattering efficiency $Q_{sca}$ and the absorption efficiency $Q_{abs}$ vary with the gain coefficient α at the resonance wavelengths of $TM_{1,1}$, $TM_{1,2}$, $TM_{1,3}$ and $TM_{1,4}$ respectively. In FIG. 7, when an optical gain coefficient increases from 0, the scattering efficiency $Q_{sca}$ will increase rapidly at a certain gain coefficient α, but the absorption efficiency $Q_{abs}$ will rapidly decrease to 0, which significantly reduces a metal loss. When the gain coefficient α increases to a certain value, amplitudes of the scattering efficiency and the absorption efficiency changes very sharply. When the gain coefficient α is further increased, the amplitudes of the scattering efficiency and the absorption efficiency further decreases rapidly. Therefore, there is always an optimal α value to make the scattering efficiency and the absorption efficiency reach maximum amplitudes, and make the scattering efficiency plus the absorption efficiency approximately equal to zero. This conclusion has been proved by previous studies. As a result, for the four resonance modes of $TM_{1,1}$, $TM_{1,2}$, $TM_{1,3}$ and $TM_{1,4}$, 80.614 $cm^{-1}$, 113.422 $cm^{-1}$, 161.42 $cm^{-1}$ and 400.3 $cm^{-1}$ may be considered as lasing threshold respectively, which may be achieved experimentally, for example, quantum wells of block semiconductor InGaAs (Indium Gallium Arsenide), InGaAsP/InP (Indium Gallium Arsenide Phosphorus/Indium Phosphide) and InGaAsN/InP (Indium Gallium Arsenide Nitrogen/Indium Phosphide) stimulated at room temperature may exceed 1000 $cm^{-1}$. Here the lasing threshold of $TM_{1,1}$ is the smallest, mainly because the $TM_{1,1}$ resonance mode has a larger Purcell factor.

Figure 8:
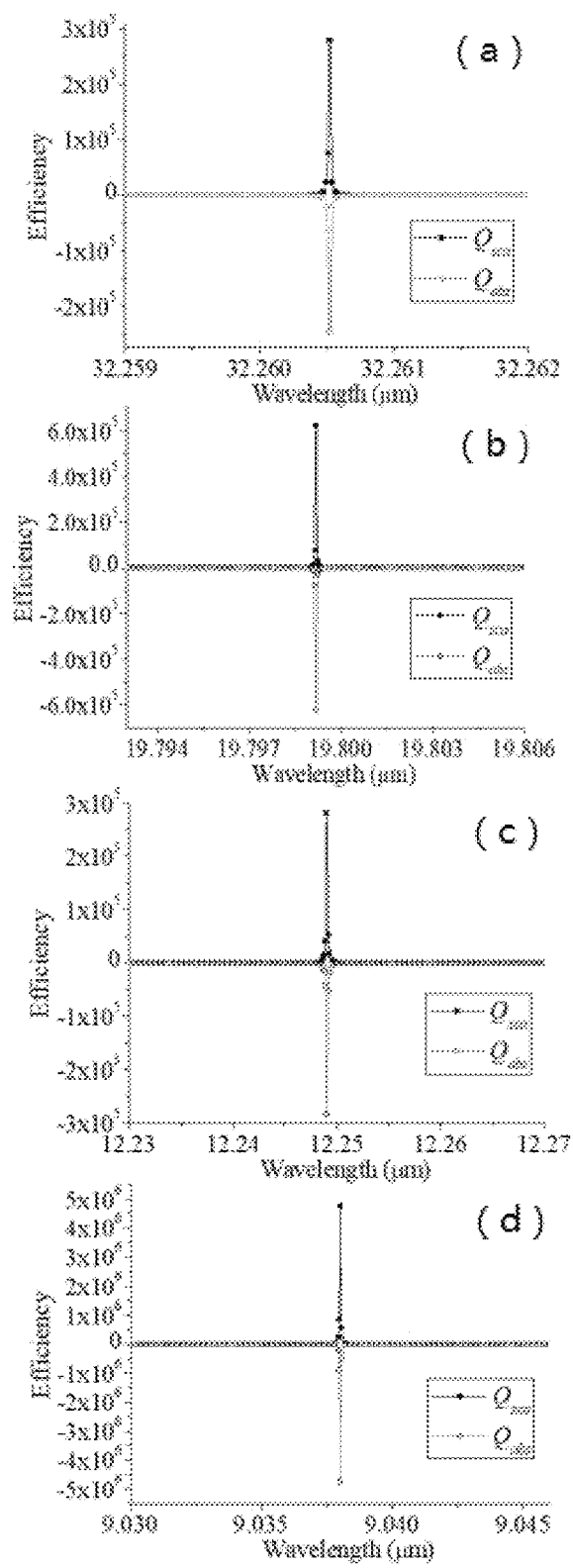
FIG. 8 is schematic diagrams showing absorption efficiency spectra and scattering efficiency spectra corresponding to the gain coefficients of 80.615 $cm^{-1}$, 113.422 $cm^{-1}$, 161.42 $cm^{-1}$ and 400.3 $cm^{-1}$ provided by the present disclosure; wherein, FIG. 8 (a) is a schematic diagram showing the absorption efficiency spectrum and the scattering efficiency spectrum corresponding to the gain coefficient of 80.615 $cm^{-1}$.

As shown in FIG. 8, the embodiment of the present disclosure further calculates scattering efficiency spectra and absorption efficiency spectra of the hyperbolic dispersive cavity 2 when the gain coefficients of the gain material reach the thresholds of 80.614 $cm^{-1}$, 113.422 $cm^{-1}$, 161.42 $cm^{-1}$ and 400.3 $cm^{-1}$ respectively. In FIG. 8, the abscissa is the wavelength and the ordinate is the efficiency. It may be found from FIG. 8 that the amplitudes of the scattering efficiency $Q_{sca}$ and the absorption efficiency $Q_{abs}$ may reach the order of magnitude of $10^5$ to $10^6$ at the resonance wavelengths of the four modes $TM_{1,1}$, $TM_{1,2}$, $TM_{1,3}$ and $TM_{1,4}$, which indicates that the structure design of the hyperbolic dispersive cavity 2 with the introduced gain material provided by the present disclosure may realize the lasing at four wavelengths.

A higher Purcell factor, a smaller volume and a higher quality factor are all important indicators to measure the plasmonic nanolasers. The laser based on propagating surface plasmon has a high quality factor, but it is not conducive to integration due to its large size. The laser based on localized surface plasmon has a smaller volume for integration, but has a quality factor greatly reduced due to its intrinsic metal loss.

The spherical cavity 2 based on the hyperbolic dispersive relation similar to the whispering gallery mode provided by the disclosure may greatly reduce the size while realizing the high quality factor, which integrates advantages of the above two to have a better working quality. It is also expected that the multi-wavelength plasmonic nanolaser base on the whispering gallery mode of the present disclosure may be integrated into a photonic chip as an effective way.

Because the graphene plasmon has unique excellent performances, such as the electrical adjustability, the low intrinsic loss, the high optical field localization, and the continuously adjustable resonance frequency from mid-infrared to terahertz, compared with the common metal-dielectric hyperbolic dispersive characteristic, the graphene-dielectric hyperbolic dispersive metamaterial used by the depth-subwavelength graphene-dielectric hyperbolic dispersive cavity 2 of the disclosure not only may highly localize the energy of the electromagnetic wave in the more depth-subwavelength cavity, but also may reduce the ohmic loss and improve the quality factor. Therefore, the design of the nanolaser based on the depth-subwavelength graphene-dielectric hyperbolic dispersive cavity of the present disclosure may not only be configured to produce the nanolaser in the mid-infrared or even the terahertz band, but also provide a new idea for the development of the compacter and lower-threshold plasmonic nanolaser.

The present disclosure calculates the dispersive relation corresponding to a multilayer dielectric/graphene spherical cavity structure (which may also be a hemisphere or other structure) by using the effective dielectric theory, to demonstrate that the dispersive relation may support the infinite wave vector k, and has the hyperbolic dispersive characteristic. Therefore, this type of the hyperbolic dispersive microcavity 2 used in the present disclosure may localize the electromagnetic wave in a size of depth-subwavelength. The present disclosure takes the spherical cavity as an example, and further uses the Mie scattering theory to solve the extinction efficiency of the spherical hyperbolic dispersive resonant cavity composed of multilayer dielectric/graphene. Using the characteristics that the multilayer dielectric/graphene cavity may support multiple resonance modes with a same angular momentum and different mode orders, the quality factor and the mode volume of the resonance mode are calculated to obtain the value of the Purcell factor, so as to determine the threshold of the nanolaser. A mode with a high Purcell factor is selected to further calculate a localization characteristic of the microcavity to an electromagnetic field. Taking the spherical cavity as an example, the mode of the dipole resonance may localize the electromagnetic field in different dielectric layers, and the mode has a high Purcell factor. Using the above characteristics of the mode, the gain material may be introduced into different dielectric layers, so that the spherical hyperbolic dispersive microcavity may achieve a multi-wavelength lasing at different modes and orders. Then, in the present, the lasing threshold when the gain material is placed in the microcavity is calculated. For example, the spherical hyperbolic dispersive microcavity 2 composed of the four pairs of dielectric (with a thickness of 50 nm)/graphene (with a thickness of 0.5 nm) layers with a diameter of 404 nm may achieve lasing at four wavelengths. Wherein, the lasing threshold at the wavelength of 32.3 μm is only 80.6 cm$^{-1}$, which is much smaller than a lasing threshold based on other plasmon materials or other structures. A lasing wavelength may also be tuned by selecting other dielectric or changing the number of pairs of the dielectric/graphene layers.

Of course, the structure of the nanolaser provided by the embodiment of the present disclosure is just a common situation. In practical applications, the depth-subwavelength graphene-dielectric hyperbolic dispersive cavity 2 may be selected with different number of pairs of the dielectric/graphene layers to realize a low-threshold nanolaser. In addition, the structure of the depth-subwavelength graphene-dielectric hyperbolic dispersive cavity 2 is not limited to the spherical structure, and the hemisphere or other multilayer graphene/dielectric hyperbolic dispersive cavity may also be used to realize the low-threshold nanolaser. Finally, the low-threshold nanolaser may also be realized by using a material with a refractive index different from the dielectric provided by the present disclosure, or using other two-dimensional materials with a plasmonic property instead of the graphene to construct the hyperbolic dispersive cavity.

The principles and implementations of the present disclosure have been described herein with specific examples, and the above embodiments are described only for a better understanding of the methods and core concepts of the present disclosure. Meanwhile, the detailed implementations and the application scope could be amended by those skilled in the art according to the teachings of this disclosure. In conclusion, the contents of the description should not be interpreted as a limitation to the disclosure.

What is claimed is:

1. A nanolaser based on a depth-subwavelength hyperbolic dispersive cavity of graphene-dielectric, wherein, the nanolaser comprises a pumping light source and the depth-subwavelength hyperbolic dispersive cavity of graphene-dielectric; and the depth-subwavelength hyperbolic dispersive cavity of graphene-dielectric is a spherical or hemispherical hyperbolic dispersive microcavity formed by alternately wrapping a dielectric core with graphene layers and dielectric layers;

a gain material is introduced into the dielectric layer;

a duty ratio and a dielectric constant of the graphene layer and a refractive index of the dielectric layer meet following formulas: $\varepsilon_r = \varepsilon_G n^2/((1-f_G)\varepsilon_G + f_G n^2) > 0$ and $\varepsilon_\theta = \varepsilon_t = f_G \varepsilon_G + (1-f_G)n^2 < 0$; wherein, $f_G$ represents the duty ratio of the graphene layer, $\varepsilon_G$ represents the dielectric constant of the graphene layer, n represents the refractive index of the dielectric layer; $\varepsilon_r$ represents a dielectric constant in a $\hat{r}$ direction; $\varepsilon_\theta$ represents a dielectric constant in a $\hat{\theta}$ direction; $\varepsilon_t$ represents a dielectric constant in a $\hat{\phi}$ direction;

a pumping light generated by the pumping light source is vertically incident on the depth-subwavelength hyperbolic dispersive cavity of graphene-dielectric to form a population inversion in the dielectric layers, so as to realize an optical pumping process generated by a laser;

meanwhile, a surface plasmon mode is formed by the vertically incident pumping light stimulated in the resonant cavity, of which meeting a resonance condition may generate a resonance in the resonant cavity;

under a condition of optical pumping, the dielectric layer continuously forms the population inversion to complete a stimulated radiation;

the surface plasmon mode in the resonant cavity is emitted from an end of the depth-subwavelength hyperbolic dispersive cavity of graphene-dielectric to form a laser.

2. The nanolaser according to claim 1, wherein the pumping light source is a solid laser or a semiconductor laser.

3. The nanolaser according to claim 1, wherein a material of the dielectric layer is magnesium fluoride or silicon dioxide.

4. The nanolaser according to claim 1, wherein the gain material is selected from gallium arsenide, indium phosphide, cadmium sulfide, zinc oxide, gallium nitride, cadmium selenide, zinc sulfide, or organic material with an optical gain.

5. The nanolaser according to claim 1, wherein a thickness of the graphene layer is 0.5 nm and a thickness of the dielectric layer is 50 nm.

6. The nanolaser according to claim 1, wherein the depth-subwavelength hyperbolic dispersive cavity of graphene-dielectric is a spherical hyperbolic dispersive microcavity formed by alternately wrapping four pairs of dielectric layers/core and graphene layers; and a diameter of the spherical hyperbolic dispersive microcavity is 404 nm.

7. The nanolaser according to claim 6, wherein a lasing threshold of the spherical hyperbolic dispersive microcavity is 80.6 $cm^{-1}$ at a wavelength of 32.3 μm.

* * * * *